United States Patent
Lee et al.

(10) Patent No.: US 6,777,793 B2
(45) Date of Patent: Aug. 17, 2004

(54) PACKAGING SUBSTRATE WITH ELECTROSTATIC DISCHARGE PROTECTION

(75) Inventors: Meng-Tsang Lee, Kaoshiung (TW); Kuang-Lin Lo, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 79 days.

(21) Appl. No.: 10/289,852

(22) Filed: Nov. 7, 2002

(65) Prior Publication Data

US 2003/0090861 A1 May 15, 2003

(30) Foreign Application Priority Data

Nov. 9, 2001 (TW) ........................................ 90127887 A

(51) Int. Cl.⁷ .............................................. H01L 23/02
(52) U.S. Cl. ....................... 257/678; 257/698; 257/725; 438/107; 438/110
(58) Field of Search ................................ 257/678, 698, 257/725; 438/107, 110

(56) References Cited

U.S. PATENT DOCUMENTS 5,185,654 A * 2/1993 Mosher et al. .............. 257/659
6,613,979 B1 * 9/2003 Miller et al. ................ 174/52.2
2003/0102016 A1 * 6/2003 Bouchard ..................... 134/32
2004/0048009 A1 * 3/2004 Extrand et al. ............. 428/34.1

FOREIGN PATENT DOCUMENTS

JP                59225550 A  * 12/1984  ........... H01L/23/48

* cited by examiner

Primary Examiner—George Eckert
Assistant Examiner—Matthew E. Warren
(74) Attorney, Agent, or Firm—Seyfarth Shaw LLP

(57) ABSTRACT

The present invention relates to a packaging substrate with electrostatic discharge protection. The packaging substrate is deposited in a packaging mold, and the packaging mold comprises a plurality of injection pins for pushing the packaging substrate out of the packaging mold. A first copper-mesh layer and a second copper-mesh layer of the packaging substrate are electrically connected to each other via position pins. A bottom side of the packaging substrate comprises a plurality of recesses in positions corresponding to positions of the injection pins. The recesses pass the second copper-mesh layer to electrically connect the injection pins to the second copper-mesh layer, and static electric charges are conducted to the injection pins via the second copper-mesh layer and away from the packaging substrate. It prevents dies to be packaged from damage due to electrostatic discharge so as to raise the yield rate of semiconductor package products.

2 Claims, 5 Drawing Sheets

PACKAGING SUBSTRATE WITH ELECTROSTATIC DISCHARGE PROTECTION

BACKGROUND OF THE INVENTION

1. Field of the Invention

The present invention relates to a packaging substrate, more particularly, to a packaging substrate with electrostatic discharge protection.

2. Description of the Related Art

The working voltage of an integrated circuit is typically of 5 volts or less. When the integrated circuit is applied with relatively high voltage, the integrated circuit will usually be damaged. Static charge is generated from friction, induction and contact; but the popularly used chips are rarely designed with a circuit for electrostatic discharge protection to safeguard against damage to chips from static electricity. Most chips are not equipped with such an electrostatic protective circuit.

In addition, during the process of packaging or molding the dies, when the mould compound is injected to enclose the die, static charge will be generated from friction, induction and contact between the mould compound and the substrate or other medium. The electrostatic discharge will damage the die and fail the semiconductor package products.

Therefore, it is necessary to provide an innovative and advanced packaging substrate so as to solve the above problem.

SUMMARY OF THE INVENTION

One objective of the present invention is to provide a packaging substrate with electrostatic discharge protection. The packaging substrate is deposited into a packaging mold, and the packaging mold comprises a plurality of injection pins for pushing the packaging substrate out of the packaging mold. A first copper-mesh layer and a second copper-mesh layer of the packaging substrate are electrically connected to each other via position pins. A bottom side of the packaging substrate comprises a plurality of recesses in positions corresponding to positions of the injection pins. The recesses pass the second copper-mesh layer to electrically connect the injection pins to the second copper-mesh layer, and static electric charges are conducted to the injection pins via the second copper-mesh layer and away from the packaging substrate. It prevents dies to be packaged from damage due to electrostatic discharge so as to raise the yield rate of semiconductor package products.

Therefore, the packaging substrate according to the invention can safely conduct the static electricity generated during packaging away from the packaging substrate, preventing the dies to be packaged from damage due to electrostatic discharge.

DETAILED DESCRIPTION OF THE INVENTION

Figure 1:
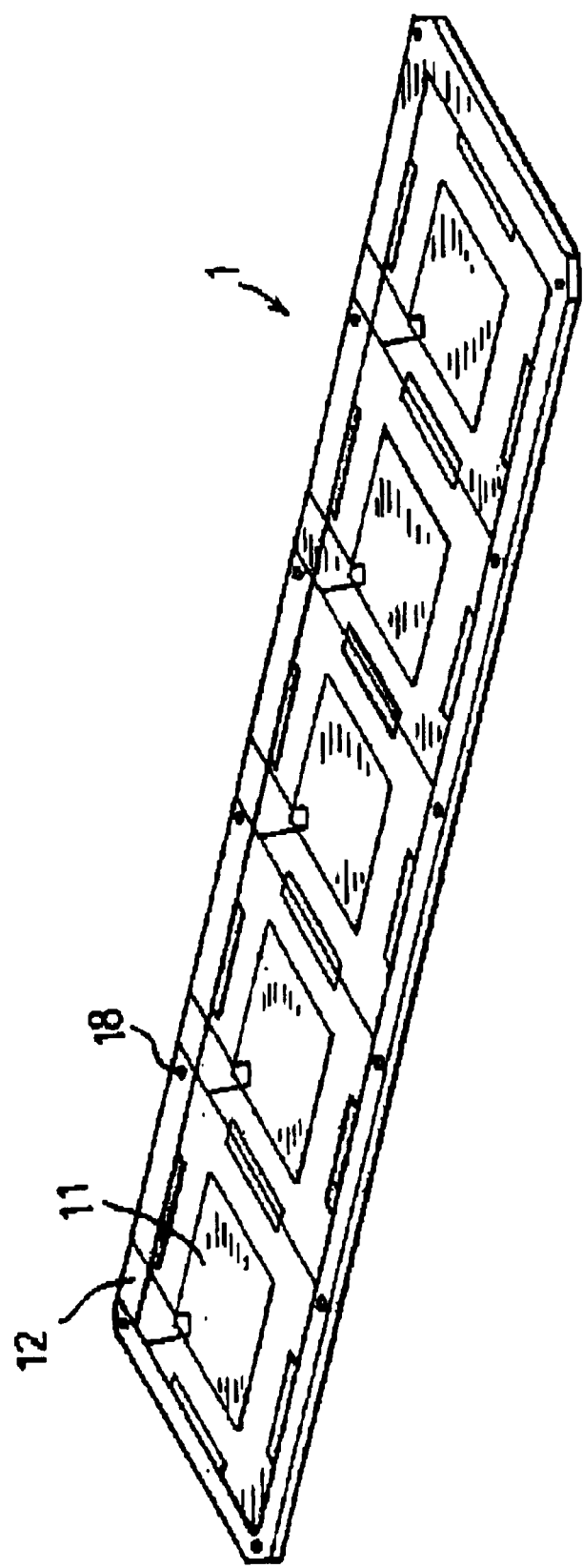
FIG. 1 shows a perspective view of the first embodiment of the packaging substrate according to the invention.
Figure 2:
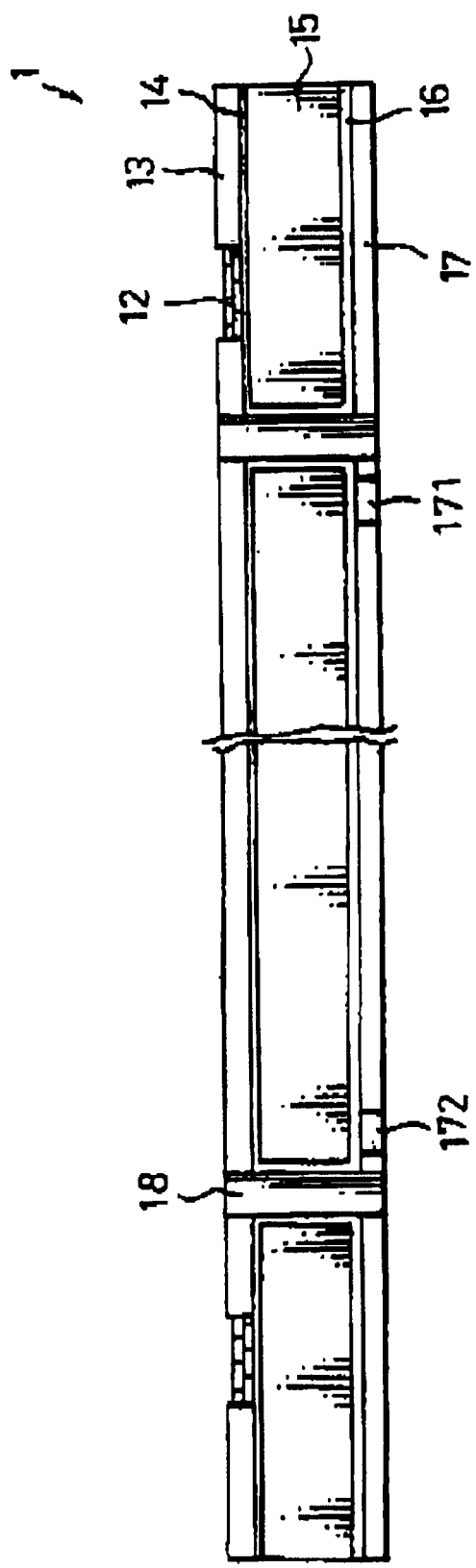
FIG. 2 shows a cross-sectional view of the fist embodiment of the packaging substrate according to the invention.
Figure 3:
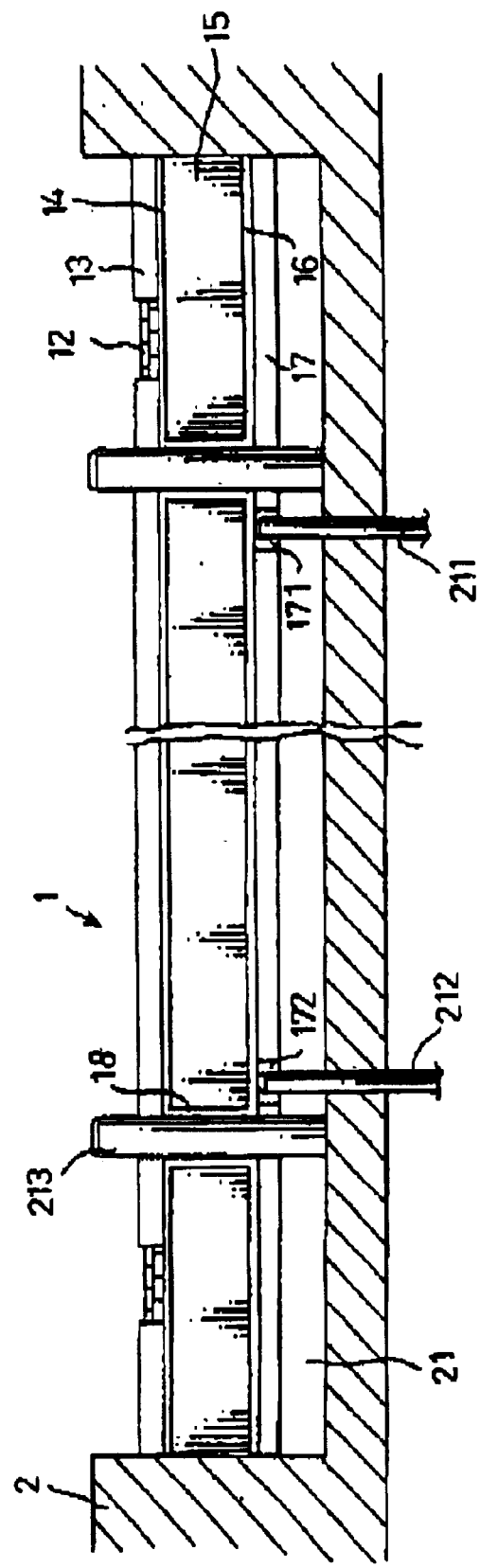
FIG. 3 shows a cross-sectional view illustrating the operation of the first embodiment of the packaging substrate according to the invention.

Referring to FIGS. 1, 2 and 3, according to the first embodiment of the invention, a packaging substrate 1 with electrostatic discharge protection is deposited in a packaging mold 2, and the packaging mold 2 comprises a recess 21 with a shape corresponding to the packaging substrate 1 for receiving the packaging substrate 1, The recess 21 comprises a plurality of injection pins 211, 212 for pushing the packaging substrate 1 out of the packaging mold 2.

The packaging substrate 1 comprises: five die pads 11, five mold gates 12, a top side 13, a first copper-mesh layer 14, a dielectric layer 15, a second copper-mesh layer 16, a bottom side 17, and a plurality of position holes 18. The die pad 11 supports the die. Each mold gate 12 is connected to each die pad 11 at the periphery of the packaging substrate 1 and through which the mould compound is injected into the die pads 11. The mold gates 12 are at the top side 13 of the packaging substrate 1.

The first copper-mesh layer 14 is formed on the: periphery of the top side 13 of the packaging substrate 1, and is electrically connected to the mold gates 12. The second copper-mesh layer 16 is formed on the periphery of the bottom side 17 of the packaging substrate 1. The dielectric layer 15 is formed between the first copper-mesh layer 14 and the second copper-mesh layer 16.

A plurality of position holes 18 are formed on the periphery of the packaging substrate 1 and pass through between the top side 13 and the bottom side 17 of the packaging substrate 1. The position holes 18 are to put the position pins 213 around to position the packaging substrate 1 into the recess 21 of the mold 2. The inner surface of the position pins 16 comprises a conductive layer or a conductive material to electrically connect the first copper-mesh layer 13 and the second copper-mesh layer 18.

As shown in FIG. 3, the bottom side 17 comprises a plurality of recesses 171, 172 formed in positions corresponding to positions of the injection pins 211, 212. The recesses 171, 172 pass to the second copper-mesh layer 16 to expose the second copper-mesh layer 16. When the injection pins 211, 212 push the packaging substrate 1 out of the packaging mold 2, the injection pins 211, 212 extend into the recesses 171, 172, contacting and electrically connecting the second copper-mesh layer 16.

After completing packaging of the dies and separating the packaging substrate 1 and the packaging mold 2, the injection pins 211, 212 push the packaging substrate 1 out of the packaging mold 2, so as to keep the injection pins 211, 212 contacting and electrically connecting the second copper-mesh layer 16. If static electric charges are generated when separating, the static electric charges can be conducted, to the injection pins 211, 212 via the first copper-mesh layer 14, the position holes 18 and the second copper-mesh layer 16 and then conducted away from the packaging mold 2.

Therefore, by using the packaging substrate 1 according to the invention, the static electricity generated, when separating, can be safely conducted away from the packaging substrate 1 and to the packaging mold 2, thereby preventing the dies to be packaged from damage due to electrostatic discharge so as to improve the quality of semiconductor package products.

Figure 4:
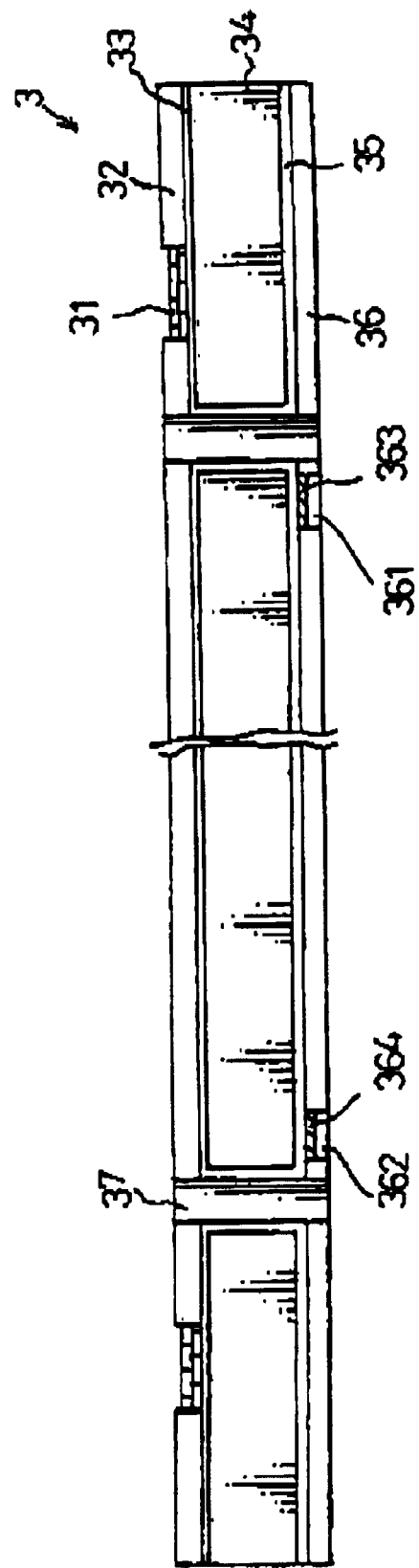
FIG. 4 shows a cross-sectional view of the second embodiment of the packaging substrate according to the invention.

Referring to FIG. 4, according to the second embodiment of the invention the packaging substrate 3 with electrostatic discharge protection and the packaging substrate 1 in the first embodiment both comprise: die pads (not shown in the figure), mold gates 31, a top side 32, a first copper-mesh layer 33, a dielectric layer 34, a second copper-mesh layer 35, a bottom side 36, and a plurality of position holes 37. In second embodiment the configurations and layout are generally similar to those in the first embodiment of the packaging substrate 1.

In the second embodiment, the bottom side 36 of the packaging substrate 3 comprises a plurality of recesses 361, 362 formed in positions corresponding to positions of the injection pins 411, 412 of the packaging mold 4. Each of the recesses 361, 362 comprises a metal layer 363, 364 formed under the second copper-mesh layer 35 and electrically connecting the second copper-mesh layer 35.

Figure 5:
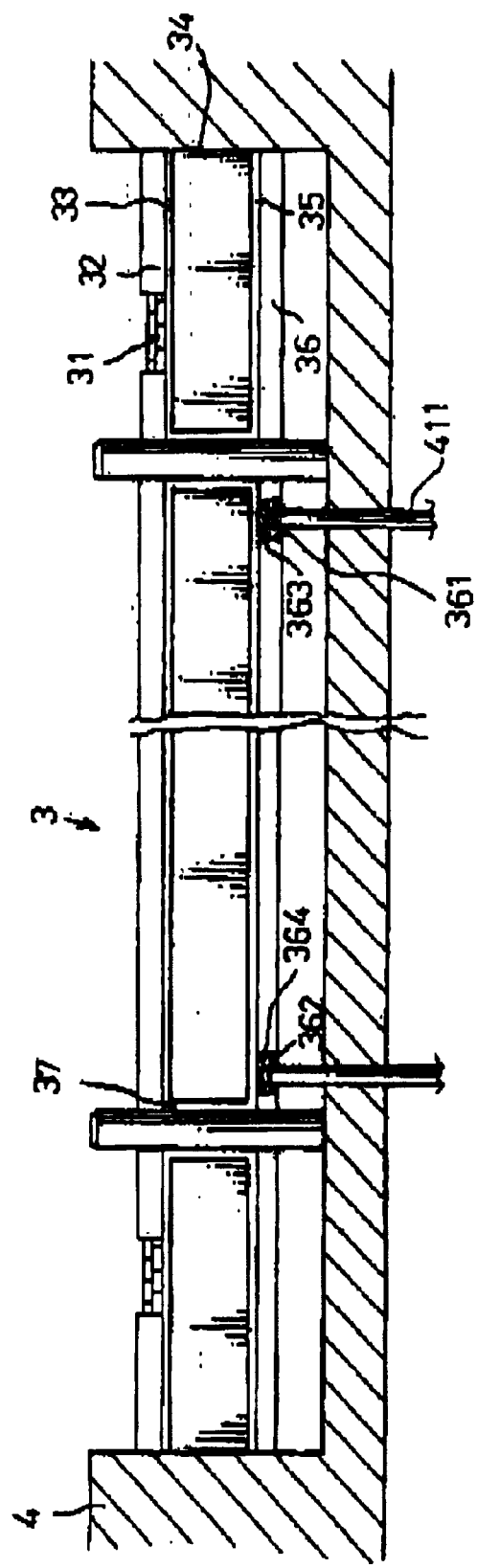
FIG. 5 shows a cross-sectional view illustrating the operation of the second embodiment of the packaging substrate according to the invention.

Referring to FIG. 5, when the injection pins. 411, 412 push the packaging substrate 3 out of the packaging mold 4, the injection pins 411, 412 extend into the recesses 361, 362, and electrically connects the injection pins 411, 412 to the metal layers 363, 364.

Similarly, when separating the packaging substrate 3 and the packaging mold 4, the injection pins 411, 412 can keep electrically contacting the metal layers 363, 364. If static electric charges are generated when separating, the static electric charges can be conducted to the injection pins 411, 412 via the first copper-mesh layer 33, the position holes 37, the second copper-mesh layer 35, and the metal layers 363, 364 and then conducted away from the packaging mold 4.

Therefore, by using the packaging substrate 3 according to the second embodiment of the invention, the static charge generated when separating can be safely conducted away from the packaging substrate 3, thereby preventing the dies to be packaged from damage due to electrostatic discharge so as to improve the quality of semiconductor package products.

While embodiments of the present invention have been illustrated and described, various modifications and improvements can be made by persons skilled in the art. The embodiments of the present invention are therefore described in an illustrative but not restrictive sense. It is declared that the present invention may not be limited to the particular forms as illustrated, and that all modifications which maintain the spirit and scope of the present invention are within the scope as defined in the appended claims.

What is claimed is:

1. A packaging substrate with electrostatic discharge protection, which is deposited in a packaging mold, the packaging mold comprising a plurality of injection pins for pushing the packaging substrate out of the packaging mold, the packaging substrate comprising:

a top side and a bottom side;

at least a die pad for supporting a die;

at least a mold gate formed at the top side of the substrate, the mold gate extending from an edge of the substrate to the die pad to inject mould compound into the die pad;

a first copper-mesh layer formed on the periphery of the top side of the substrate, the first copper-mesh layer electrically connected to the mold gate;

a second copper-mesh layer formed on the periphery of the bottom side of the substrate;

a dielectric layer formed between the first copper-mesh layer and the second copper-mesh layer; and a plurality of position holes formed on the periphery of the packaging substrate and penetrating through the top side and the bottom side, and electrically connecting the first copper-mesh layer and the second copper-mesh layer;

wherein the bottom side comprises a plurality of recesses formed in positions corresponding to positions of the injection pins, and the recesses penetrate the second copper-mesh layer to electrically connect the injection pins to the second copper-mesh layer, and static electric charges are conducted to the injection pins via the second copper-mesh layer and away from the packaging substrate.

2. The packaging substrate according to claim 1, wherein each of the recesses further comprises a metal layer formed under the second copper-mesh layer and electrically connecting the second copper-mesh layer, and wherein the metal layer contacts and electrically connects the injection pins.

* * * * *